(12) United States Patent
Simon et al.

(10) Patent No.: US 7,649,179 B2
(45) Date of Patent: Jan. 19, 2010

(54) LEAD OXIDE BASED PHOTOSENSITIVE DEVICE AND ITS MANUFACTURING METHOD

(75) Inventors: Matthias Simon, Aachen (DE); Detlef Uwe Wiechert, Alsdorf (DE); Claus Feldmann, Ettlingen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 38 days.

(21) Appl. No.: 11/815,457

(22) PCT Filed: Jan. 26, 2006

(86) PCT No.: PCT/IB2006/050282

§ 371 (c)(1), (2), (4) Date: Aug. 3, 2007

(87) PCT Pub. No.: WO2006/085230

PCT Pub. Date: Aug. 17, 2006

(65) Prior Publication Data

US 2008/0156995 A1    Jul. 3, 2008

(30) Foreign Application Priority Data

Feb. 8, 2005    (EP) ................... 05100857

(51) Int. Cl.
*G01T 1/24* (2006.01)
(52) U.S. Cl. ................................. 250/370.12
(58) Field of Classification Search .......... 250/370.01–370.15; 378/98.8
See application file for complete search history.

(56) References Cited

U.S. PATENT DOCUMENTS

| | | | |
|---|---|---|---|
| 1,275,815 A | 8/1918 | Wilkinson | |
| 2,888,370 A | 5/1959 | Damon et al. | |
| 3,444,412 A | 5/1969 | De Haan et al. | |
| 3,468,705 A | 9/1969 | Schottmiller et al. | |
| 3,497,382 A | 2/1970 | Kwestroo et al. | |
| 3,543,025 A * | 11/1970 | Stanton ....................... | 430/55 |
| 3,832,298 A | 8/1974 | Weiss et al. | |
| 3,888,634 A | 6/1975 | Shindo | |
| 4,189,406 A | 2/1980 | Weiss et al. | |
| 4,260,887 A | 4/1981 | Dannert et al. | |
| 4,292,119 A | 9/1981 | Glass | |
| 5,132,541 A | 7/1992 | Conrads et al. | |

(Continued)

OTHER PUBLICATIONS

Simon et al., "PbO as direct conversion x-ray detector material," 2004, Physics of Midical imaging, Proceedings of SPIE, vol. 5368, pp. 188-199.*

(Continued)

*Primary Examiner*—David P Porta
*Assistant Examiner*—Kiho Kim

(57) ABSTRACT

A method for manufacturing a photo-responsive device having a photo-sensitive layer is proposed. The method comprises the following steps: a) providing a clean substrate inside an evacuated evaporation chamber; b) evaporating lead oxide (PbO) from a first crucible to form a seeding layer on the surface of the substrate; c) affecting upon the seeding layer such that only tetragonal lead oxide forms the seeding layer and/or such that the initially grown orthorhombic lead oxide forming the seeding layer is transformed into tetragonal lead oxide; and d) continuing to evaporate lead oxide until the final thickness of the photo-sensitive layer has been deposited onto the substrate. As a result the method yields a photo-responsive device comprising a photo-sensitive layer of lead oxide, which entirely consists of tetragonal lead oxide.

10 Claims, 1 Drawing Sheet

U.S. PATENT DOCUMENTS 6,034,373 A * 3/2000 Shahar et al. .......... 250/370.01
6,121,647 A * 9/2000 Yano et al. ................. 257/295

OTHER PUBLICATIONS

H.J. Terpstra et al: "Electronic Structure of the Lead Monoxides: Band-Structure Calculations and Photoelectronic Spectra", Phys. Rev., vol. B 52, No. 16, pp. 11690-11697, 1995.

M. F. Tompsett and J. St. Noble, "In-Situ Scanning High-Energy Electron Diffraction Studies of Evaporated Lead Monoxide Films", Thin Solid Films 5, pp. 81-96, 1970.

D.U. Wiechert et al: "Raman Spectroscopic Investigations of PBO Layers", Journal of Solid State Chem, 2004.

* cited by examiner

LEAD OXIDE BASED PHOTOSENSITIVE DEVICE AND ITS MANUFACTURING METHOD

FIELD OF THE INVENTION

The invention is related to a method for manufacturing a photo-responsive device. The invention is also related to a photo-responsive device having a photo-sensitive layer, which entirely consists of tetragonal lead oxide.

BACKGROUND OF THE INVENTION

Photo-responsive devices, in particular x-ray detectors are a key component for medical radiology where digital radiography becomes increasingly important. Digital radiography offers the potential of improved image quality and provides at the same time opportunities in medical image management, computer-aided diagnosis and teleradiology. Image quality depends critically on the precise and accurate detection of the x-ray beam transmitted by the patient and hence on the performance of the x-ray detector. Key parameters for the x-ray detector are spatial resolution, uniformity of response, contrast sensitivity, dynamic range, acquisition speed and frame rate.

In the field of medical applications flat dynamic x-ray detectors (FDXD) play an important role. Flat detectors are used by several manufacturers of commercially available x-ray devices for medical diagnostics. At present two different technologies for flat detectors coexist. One type of detector relies on so-called indirect conversion of x-rays, i.e. an absorbed x-ray quantum is converted into visible light and subsequently into an electrical signal, which is necessary for the digital processing of the captured image. Another type of detector relies on the direct conversion of x-rays, i.e. an x-ray quantum is directly converted into an electrical signal. In general, direct conversion detectors provide a higher spatial resolution and a higher signal-to-noise ration compared to indirect conversion detectors.

Flat direct conversion detectors comprise an absorption layer of a semi conducting material having a large band gap. In the absorption layer an absorbed x-ray quantum is converted into an electrical charge. Typically, the absorption or conversion layer is made of selenium, lead iodide, mercury iodide, lead oxide, cadmium telluride, cadmium zinc telluride. In general, the conversion layer is directly deposited on a matrix of thin film electronic circuitry. The following description of the prior art and the invention is focused on the use of lead oxide (PbO) as conversion layer In direct conversion materials like the ones listed above, an electrical signal is generated if charge carriers, i.e. holes or electrons, move in the electrostatic field in the conversion layer. However, the conversion layer contains electrical defects like crystallographic defects, impurities etc. capable to capture free electric charge carriers. Captured charge carriers are also denominated as "localised" charge carriers. Localised charge carriers are lost for the generation of an electrical output signal of the detector. But localised charge carriers may become movable again, i.e. they become "delocalised". Delocalised charge carriers contribute again to the electrical output signal of the detector. The principle of this process is the same for electrons (negative charge carriers) and holes (positive charge carriers). In thermodynamic equilibrium the average number of charge carriers becoming localised and delocalised is equal. Since the localisation and delocalisation process, respectively, requires some time it is obvious that the localisation and delocalisation of charge carriers has an impact on the dynamic response time of an x-ray detector.

Specifically in x-ray applications in which the detector is moving relative to an imaged object, the response time is critical for the resolution of transitions between areas of different physical properties, e.g. soft tissue and a bone of a patient. The transition is visible in an image as a dark to bright contrast and the sharpness of the image depends on the response time of the x-ray detector. Examples for such applications are volume imaging and the detection of a contrast agent flowing through vessels.

In practice, a long response time entails dynamic artefacts, which occur e.g. in detectors comprising direct conversion materials. Disturbing residual signals after the termination of an x-ray irradiation as well as a delayed signal rise at the beginning of an irradiation have been observed. The dynamic artefacts are visible as disturbing after images, in particular in dynamic imaging processes with a high repetition rate like volume imaging or fluoroscopy applications. Dynamic artefacts also occur in imaging moving objects, as e.g. a beating heart; likewise a respiration movement of a patient can cause dynamic artefacts.

Frequently, the reason for the mentioned dynamic artefacts is the relatively slow filling and emptying of electrical defects with charge carriers in the conversion layer.

Electrically active defects may be created by a discontinuity of the electronic properties in the growth direction of the conversion layer. Specifically the semi conducting material lead oxide (PbO) exists in two different crystallographic phases, namely tetragonal PbO (red lead oxide) and orthorhombic PbO (yellow lead oxide). In manufacturing of lead oxide layers according to conventional methods at first always a seeding layer of yellow orthorhombic lead oxide grows on the surface of the substrate. After a seeding layer of a few μm thickness has grown, the lead oxide continues to grow as red tetragonal lead oxide. Since the yellow orthorhombic PbO has a band gap of 2.7 eV and the red tetragonal PbO has a band gap of 1.9 eV there is a discontinuity present at the interface between the two different crystallographic phases of PbO. The band gap discontinuity is a significant disturbance of the electronic structure of the complete layer and represents electrical defects capable to localise free charge carriers. As it has been described above localised charge carriers can be delocalised again with a certain delay in time and entail disturbing after images.

U.S. Pat. No. 3,444,412 describes the manufacturing of a photo-responsive device having a photo-sensitive lead oxide (PbO) layer composed of sub layers of different conductivity types. The growth of the layer begins on the substrate with n-type PbO followed by a thick layer of intrinsic PbO. The final surface layer is grown from PbO to which thallium oxide has been added. Thallium oxide acts as a p-former for the PbO. The different starting materials are evaporated from the same crucible which is charged at the beginning only with PbO and subsequently recharged with a mixture of PbO and thallium oxide for growing the surface layer. Instead of thallium oxide a compound of a different element acting as a p-former for PbO or such an element itself are also disclosed. E.g. it is proposed to add $PbF_2$ to the PbO though thallium oxide is preferred. The crystallographic and electronic discontinuity inside the PbO layer next to the substrate is not addressed.

SUMMARY OF THE INVENTION

Taking this as a starting point it is a first object of the present invention to propose a manufacturing method for a photo-responsive device comprising a lead oxide layer having improved properties.

The invention proposes a method for manufacturing a photo-responsive device having a photo-sensitive layer wherein the method comprises the following steps:

a) providing a clean substrate inside an evacuated evaporation chamber;
b) evaporating lead oxide (PbO) from a first crucible to form a seeding layer on the surface of the substrate;
c) affecting upon the seeding layer such that only tetragonal lead oxide forms the seeding layer and/or such that the initially grown orthorhombic lead oxide forming the seeding layer is transformed into tetragonal lead oxide; and
d) continuing to evaporate lead oxide until the final thickness of the photo-sensitive layer has been deposited onto the substrate.

It is preferred to co-evaporate an additive during the formation of the seeding layer wherein the additive prevents the formation of orthorhombic lead oxide.

In this case it is advantageous to utilize a second crucible for co-evaporating the additive wherein the first and the second crucibles are separate crucibles allowing individual control of the evaporation process.

In a preferred variant of the inventive method $PbF_2$ is co-evaporated during the formation of the seeding layer to prevent the formation of orthorhombic lead oxide in the seeding layer. However, it is also possible to select the additive from the group of KI, $RbNO_3$, TlI, $H_2O$, HF, $NH_4F$, $H_2S$.

In order to prevent the formation of orthorhombic lead oxide in the seeding layer it is also possible to irradiate light onto the seeding layer during its growth. If the substrate is transparent for the wave length of the light, the light may also be irradiated through the substrate for transforming orthorhombic lead oxide in the seeding layer into tetragonal lead oxide.

It may be advantageous to perform thermal annealing of the finished lead oxide deposited on the substrate for transforming orthorhombic lead oxide in the seeding layer into tetragonal lead oxide.

Finally, it is also possible to apply mechanical pressure onto the seeding layer for transforming orthorhombic lead oxide in the seeding layer into tetragonal lead oxide.

A second object of the present invention is to propose photo-responsive device comprising a direct conversion layer of lead oxide having improved properties.

The invention proposes a photo-responsive device comprising a photo-sensitive layer of lead oxide (PbO) sandwiched between contacting electrodes. The photo-sensitive lead-oxide layer entirely consists of tetragonal lead oxide.

According to an improvement of the inventive photo-responsive device the contacting electrodes comprise a radiation transmissive upper electrode, wherein the upper electrode transmits the radiation which is to be detected in the photo-sensitive layer.

It is advantageous if the contacting electrodes comprise a structured lower electrode to provide for spatial resolution of radiation detected in the photo-sensitive layer. In one particular embodiment of the inventive device the lower electrode has a pixel-like structure.

BRIEF DESCRIPTION OF THE DRAWING

In the drawing exemplary embodiments of the present invention are illustrated. Similar or identical components in the Figures are denominated with corresponding or identical reference symbols. It shows.

DETAILED DESCRIPTION OF PREFERRED EMBODIMENTS

Figure 1:
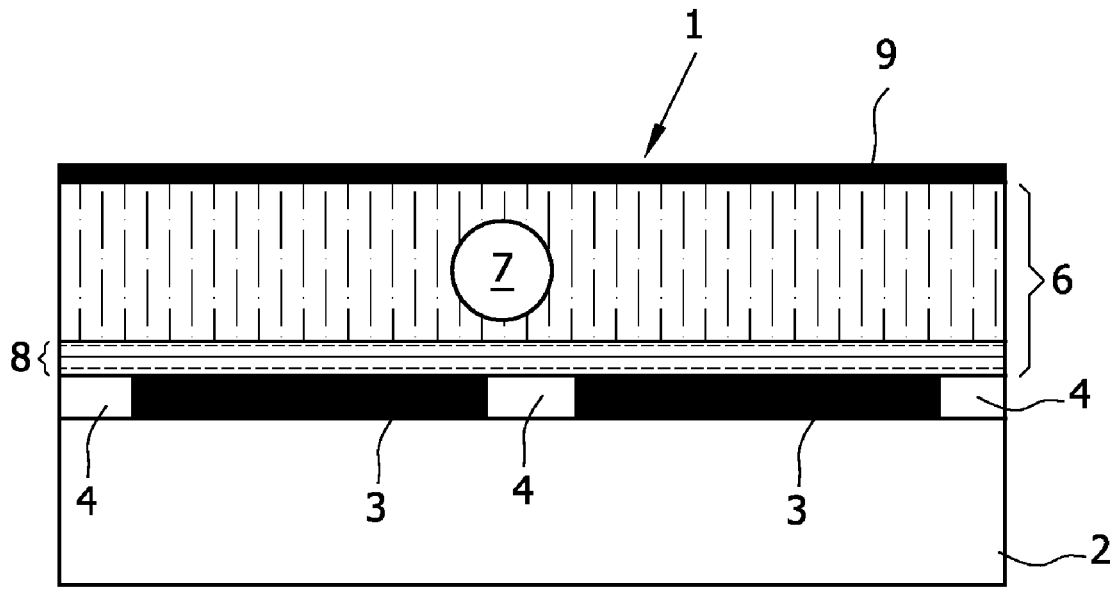
FIG. 1 a schematic sectional view of a conventional direct conversion detector having a PbO conversion layer.

FIG. 1 shows a direct conversion x-ray detector 1, which has been made according to conventional manufacturing methods. The detector 1 comprises a substrate 2 provided with structured lower electrodes 3 one of its main surfaces. The substrate 2 and the lower electrodes 3 symbolize a more complex thin film electronic circuitry similar to those known e.g. from liquid crystal display (LCD) panels. The electrodes 3 are made of aluminium but other conducting materials including other metals and light-permeable indium tin oxide (ITO) are also suitable. The gaps between the lower electrodes 3 are filled with silicon nitride as a passivation material 4. Other passivation materials known in the prior art such as polyimide are also possible as well as providing no passivation material at all. On top of the lower electrodes 3 and the passivation material 4 a layer of lead oxide 6 is deposited. The lead oxide layer 6 has a total thickness in the range of 100 μm to 1000 μm depending on the desired properties of the detector 1. Since at usual deposition temperatures of PbO layers the thermodynamic stable phase is red tetragonal PbO the major portion of the layer 6 consists of a sub or bulk layer 7 of red tetragonal PbO. However, at the beginning of the deposition of the PbO layer 6 there is always a thin seeding layer 8 of yellow orthorhombic PbO having a thickness in the range of 2 μm. According to the literature (M. F. Tompsett, J. St. Noble, "In-situ scanning high-energy electron diffraction studies of evaporated lead monoxide films" in Thin Solid Films 5, 81-96 (1970)) the creation of the orthorhombic PbO layer cannot be avoided by variation of the substrate temperature or the deposition rate. The detector 1 is completed by an upper electrode 9, which is transmissible for the x-ray radiation to be detected in the conversion layer 6. The upper electrode 9 is made of aluminium but other conducting materials including other metals and light-permeable indium tin oxide (ITO) are also suitable. In case aluminium is used as electrode material, the thickness of the upper electrode 9 is preferably less than 1 μm to ensure the x-ray transparency.

As described in the introduction the interface between the bulk layer 7 of tetragonal PbO and the seeding layer 8 of orthorhombic PbO has detrimental effects on the performance of the detector 1.

The invention therefore proposes several manufacturing methods of an x-ray detector 1 having a conversion layer 6 of red tetragonal PbO without a seeding layer 8 of yellow orthorhombic PbO.

According to a first group of embodiments of the inventive method the creation of the seeding layer 8 is prevented from the beginning. This goal is achieved by providing additives during the initial growth of the PbO layer. The additives influence the crystallisation process by increasing the mobility of the $Pb^{2+}$ and the $O^{2-}$ ions of the just deposited layer by permitting the breaking and recreation of chemical bonds. In this context $H^+$ ions (by addition of $H_2O$) and $F^-$ ions (by addition of HF, $NH_4F$ or $PbF_2$) are particularly important. In a series of experiments it has been shown that the additives are effective to improve the crystal quality of the PbO layer, to reduce the number of defects and unsaturated surface states in the PbO layer and to prevent the formation of orthorhombic PbO in the seeding layer 8. One important additive is H2O, which is added as a gas. The addition in the gas phase is also preferred for all other additives having a melting or evaporation temperature which is more than 100° C. above or below the corresponding temperatures of PbO.

Another important additive is $PbF_2$, which is co-evaporated with PbO. In this case two separate crucibles are provided that can be heated individually. In the first crucible there is a mixture of PbO and $PbF_2$ whereas in the second crucible there is pure PbO. The first crucible is heated during the growth of the first few μm of the PbO layer and then slowly cooled down. At the same time the second crucible is slowly heated up to achieve a smooth transition with an approximately constant growth rate. The co-evaporation of additives with PbO is preferred if the melting or evaporation temperature is in the range of +−100° C. of the corresponding temperatures of PbO.

In the case of $H_2O$ and $PbF_2$ the active ions, i.e. $H^+$ and $F^-$, are added in a compound in which the counter ion corresponds to one intrinsic component of PbO. However, it is also possible to use additives in which the counter ion is not incorporated in the crystal lattice of PbO, such as KI, $RbNO_3$, Tll. Finally, it is possible to utilize additives, which similar like $H_2O$ also completely dissociate into gaseous phase, such as HF, $NH_4F$, $H_2S$. The concentration of the additives is usually below 5 mol %, preferably in the range between 0.1 and 1.0 mol %.

Chemical analysis of PbO layers grown with $PbF_2$ as an additive at the beginning of the growth shows that the deposited layer contains a similar concentration as it was present in the crucible. Electrical measurements show that the deposited layer of PbO maintains the intrinsic conductivity properties, i.e. the preferred high resistivity, of the PbO starting material. Particularly, these results indicate, that the additive does not act as electrical dopant. An electrical dopant would increase the conductivity about several orders of magnitude.

According to another group of embodiments of the inventive method the initially created seeding layer 8 of orthorhombic PbO is subsequently transformed into tetragonal PbO by supplying additional energy to the PbO layer. As the reaction enthalpy between orthorhombic PbO (−217.5 kJ/mol) and tetragonal PbO (−219.1 kJ/mol) is small there is only a small energy barrier between both PbO modifications to be surmounted.

According to one variant of the inventive method the energy difference between both PbO modifications is supplied by irradiating light onto the seeding layer 8 during its growth. The wavelength for exciting vibrational modes in PbO are in the range of 10 to 50 μm, i.e. at the border of far infrared to microwave radiation ($\lambda$=10 μm corresponding to a frequency of $v$=30 THz). The intensity of the radiation is in the region of $mW/cm^2$, because the seeding layer 8 is very thin (<2 μm). If the substrate 2 is transparent for the radiation in this wavelength region it is also possible to irradiate the finished detector from the substrate side to transform the orthorhombic PbO into tetragonal PbO. Today there are commercially available tunable light sources supplying light in the required wave length region, e.g. so called Terahertz lasers.

Even simpler than the just described variant is the possibility of annealing the finished PbO layer 6 at temperatures between 150 to 400° C., but in any case below the transition temperature from tetragonal to orthorhombic PbO, which is 489° C. This variant of the inventive method requires to select a material for the substrate 2 having a similar temperature expansion coefficient like the PbO layer to avoid cracks in the PbO layer 6. The annealing should take place in vacuum or in an inert atmosphere like nitrogen or argon to avoid any other undesired chemical reactions on the surface of the PbO layer. It is noted that from a physical point of view the irradiation of the PbO layer 6 with a broad infrared light source corresponds to the annealing procedure.

Finally, according to yet another variant of the inventive method it is possible apply mechanical pressure onto the seeding layer 8. After the growth of first few micrometers the growth of the PbO layer is interrupted and an actuated stamp exerts mechanical pressure onto the initial PbO seeding layer 8 in the range of 10 to 100 kbar onto the PbO layer. Under this pressure the orthorhombic PbO transforms into tetragonal PbO and after removing the stamp from the layer the growth of the PbO layer is continued. The stamp is preferably made of stainless steel and actuated by a mechanical apparatus inside the evaporation chamber.

Figure 2:
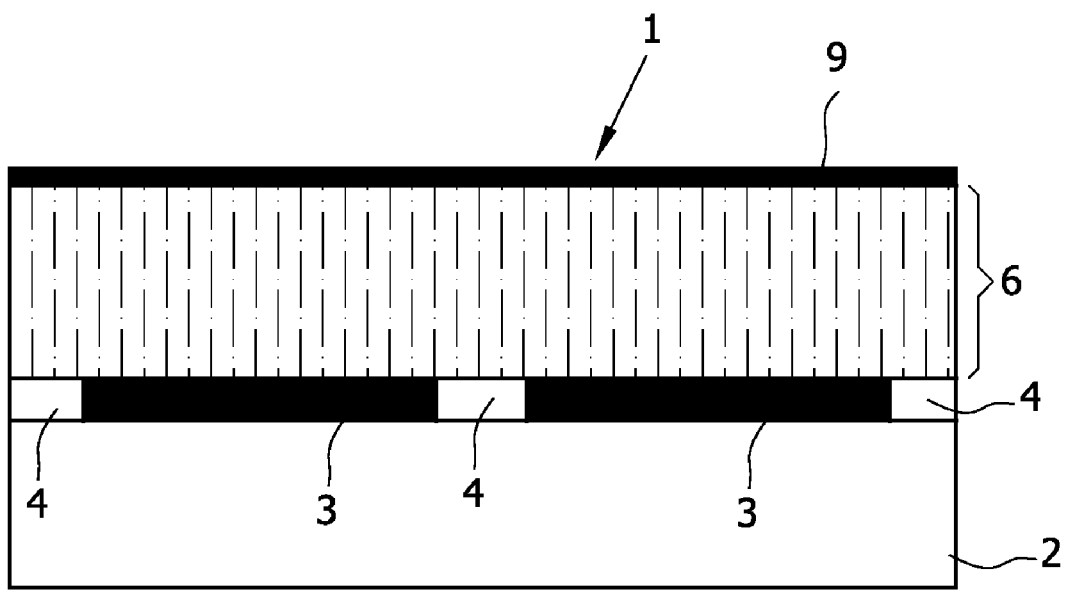
FIG. 2 a schematic sectional view of a direct conversion detector having a PbO conversion layer according to the present invention.

FIG. 2 shows an x-ray detector 1 which is manufactured according to one of the embodiments of the inventive method described above. The only and essential difference to the detector 1 shown in FIG. 1 is the absence of the seeding layer 8 consisting of yellow orthorhombic PbO. Rather in FIG. 2 the entire PbO layer 6 consists exclusively of tetragonal PbO.

In tests of detectors grown with the initial addition of $PbF_2$ as an additive reduced residual electrical signals have been found compared with detectors comprising PbO layers that have been grown without the addition of $PbF_2$. This results in a significant improvement of the dynamic characteristic of direct conversion x-ray detectors comprising a PbO absorption layer.

It is noted that the sequence of the manufacturing steps described in the claims does not limit the scope of the claims to this particular sequence. In particular, the step of affecting upon the seeding layer 8 may occur during the growth of the seeding layer or after the lead oxide layer 6 has been completed. E.g. it is possible to prevent the formation of orthorhombic lead oxide during the growth of the seeding layer. But it is also possible to transform orthorhombic lead oxide after the completion of the lead oxide layer 6 by annealing or irradiating light through a transparent substrate. The essential point of the invention is to prevent the presence of orthorhombic lead oxide in the seeding layer as it is the case before the present invention has been made. The specific way how this goal is achieved is only of secondary importance.

The invention claimed is:

1. A method for manufacturing a photo-responsive device having a photo-sensitive layer wherein the method comprises the following steps:
   a) providing a clean substrate inside an evacuated evaporation chamber;
   b) evaporating lead oxide (PbO) from a first crucible to form a seeding layer on the surface of the substrate;
   c) affecting upon the seeding layer such that only tetragonal lead oxide forms the seeding layer by co-evaporating additive $PbF_2$ during the formation of the seeding layer; and d) continuing to evaporate lead oxide until the final thickness of the photo-sensitive layer has been deposited onto the substrate.

2. The method of claim 1 further comprising utilizing a second crucible for co-evaporating the additive wherein the first and the second crucibles are separate crucibles allowing individual control of the evaporation process.

3. The method of claim 1, the further comprising co-evaporating an additive selected from the group of KI, RbNO$_3$, TlI, H$_2$O, HF, NH$_4$F, and H$_2$S.

4. The method of claim 1, further comprising thermal annealing of the finished lead oxide deposited on the substrate.

5. A method for manufacturing a photo-responsive device having a photo-sensitive layer wherein the method comprises the following steps:
  a) providing a clean substrate inside an evacuated evaporation chamber;
  b) evaporating lead oxide (PbO) from a first crucible to form a seeding layer on the surface of the substrate;
  c) affecting upon the seeding layer such that only tetragonal lead oxide forms the seeding layer by irradiating light onto the seeding layer during its growth; and
  d) continuing to evaporate lead oxide until the final thickness of the photo-sensitive layer has been deposited onto the substrate.

6. The method of claim 5 wherein the affecting upon the seeding layer is performed by irradiating light through the substrate to prevent the formation of orthorhombic lead oxide in the seeding layer, wherein the substrate is transparent for the wave length of the light.

7. The method of claim 5, wherein the affecting upon the seeding layer is performed by irradiating light onto the seeding layer after its growth to the final thickness.

8. The method of claim 7, wherein the affecting upon the seeding layer is performed by irradiating light through the substrate.

9. A method for manufacturing a photo-responsive device having a photo-sensitive layer wherein the method comprises the following steps:
  a) providing a clean substrate inside an evacuated evaporation chamber;
  b) evaporating lead oxide (PbO) from a first crucible to form a seeding layer on the surface of the substrate;
  c) affecting upon the seeding layer such that only tetragonal lead oxide forms the seeding layer by applying mechanical pressure with an actuated stamp onto the seeding layer during its growth; and
  d) continuing to evaporate lead oxide until the final thickness of the photo-sensitive layer has been deposited onto the substrate.

10. The method of claim 9, wherein the affecting upon the seeding layer is performed by applying mechanical pressure with an actuated stamp onto the seeding layer after its growth to the final thickness.

* * * * *